(12) United States Patent
Peng

(10) Patent No.: US 11,917,890 B2
(45) Date of Patent: Feb. 27, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventor: Simin Peng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 83 days.

(21) Appl. No.: 16/763,315

(22) PCT Filed: Jan. 7, 2020

(86) PCT No.: PCT/CN2020/070745
§ 371 (c)(1),
(2) Date: May 12, 2020

(87) PCT Pub. No.: WO2021/036161
PCT Pub. Date: Mar. 4, 2021

(65) Prior Publication Data
US 2023/0200189 A1 Jun. 22, 2023

(30) Foreign Application Priority Data

Aug. 29, 2019 (CN) .......................... 201910806914.X

(51) Int. Cl.
*H10K 59/80* (2023.01)
*H10K 102/00* (2023.01)
*H10K 59/65* (2023.01)
*H10K 59/127* (2023.01)

(52) U.S. Cl.
CPC ......... *H10K 59/879* (2023.02); *H10K 59/127* (2023.02); *H10K 59/65* (2023.02); *H10K 2102/331* (2023.02)

(58) Field of Classification Search
None
See application file for complete search history.

(56) References Cited

U.S. PATENT DOCUMENTS

| 2018/0004047 | A1 | 1/2018 | Yamazaki et al. | |
|---|---|---|---|---|
| 2018/0321766 | A1 | 11/2018 | Akimoto et al. | |
| 2019/0036082 | A1* | 1/2019 | Cheng | H10K 50/81 |
| 2020/0227669 | A1 | 7/2020 | Guo | |

FOREIGN PATENT DOCUMENTS

| CN | 105742510 | A | | 7/2016 | |
|---|---|---|---|---|---|
| CN | 107170789 | A | | 9/2017 | |
| CN | 108550609 | A | * | 9/2018 | ............ H01L 21/77 |
| CN | 108550609 | A | | 9/2018 | |
| CN | 109979979 | A | | 7/2019 | |
| CN | 110600611 | A | | 12/2019 | |

OTHER PUBLICATIONS

Computer-generated English-language translation of CN-108550609-A.*

* cited by examiner

*Primary Examiner* — Vu A Nguyen
(74) *Attorney, Agent, or Firm* — Nathan & Associates; Menachem Nathan

(57) ABSTRACT

The present invention provides a display panel and a display device. The display panel includes a transparent substrate and a polyimide (PI) substrate. The PI substrate is placed at one side of the transparent substrate. An uneven structure is provided inside the PI substrate or arranged on one side of the PI substrate facing the transparent substrate.

7 Claims, 6 Drawing Sheets

DISPLAY PANEL AND DISPLAY DEVICE

CROSS REFERENCE TO RELATED APPLICATIONS

The present application claims the priority of China Patent Application No. 201910806914.X, filed with the National Intellectual Property Administration on Aug. 29, 2019, titled "DISPLAY PANEL AND DISPLAY DEVICE", which is incorporated by reference in the present application in its entirety.

FIELD OF DISCLOSURE

The present invention relates to the field of display technology, and in particular, to a display panel and a display device.

DESCRIPTION OF RELATED ART

A new type of organic light-emitting diode (OLED) display device with camera under panel (CUP) technology is getting popular. A camera is placed under a panel, display components above the camera are reserved, and a pixel area emits light normally. A film layer above the camera blocks some light, and refractive indexes of different film layers are different, so light radiated to this area from outside is refracted and reflected between the film layers. Therefore, most of the light is lost, and in the end the camera receives only a small amount of light, which affects imaging performance of the camera.

Generally, light received by the camera can be increased by reducing a film thickness of a light-emitting area or a non-light-emitting area. By reducing a thickness of a polyimide (PI) film layer above the camera, light transmittance in this area is increased, light received by the camera is increased, and imaging clarity of the camera is boosted. This approach greatly reduces the thickness of the PI film layer and allows light to pass through a PI substrate to the camera as much as possible, but in fact, the light enters the camera after passing through the PI substrate and going out into the air. Since a refractive index of the air is much smaller than a refractive index of PI, a process of light entering from a dense medium into a sparse medium will cause total reflection at an interface between the PI substrate and the air, resulting in that the light cannot pass through the display panel. As a result, the light received by the camera is greatly reduced, which seriously affects clarity of the camera.

Therefore, there is a need to provide a method to increase the light received by the camera and improve the clarity of the camera.

SUMMARY

The present embodiment provides a display panel and a display device, which can solve a problem that an incident ray undergoes total reflection at an interface between the PI substrate and the air, resulting in a decrease in a light output rate. Accordingly, more light can be received by a camera, and clarity of the camera is also improved.

Accordingly, in one aspect, the present application provides a display panel, comprising:
  a transparent substrate; and
  a polyimide (PI) substrate disposed at one side of the transparent substrate, wherein an uneven structure is disposed inside the PI substrate or arranged on one side of the PI substrate facing the transparent substrate.

According to one embodiment of the present application, the PI substrate comprises a first PI film layer and a second PI film layer, the first PI film layer is disposed at one side adjacent to the transparent substrate, and the second PI film layer is disposed at one side away from the transparent substrate.

According to one embodiment of the present application, the first PI film layer is provided with a first protrusion structure, the second PI film layer is provided with a second protrusion structure, the uneven structure comprises the first protrusion structure and the second protrusion structure, and the first protrusion structure and the second protrusion structure are engaged and attached to each other at an interface between the first PI film layer and the second PI film layer.

According to one embodiment of the present application, the first protrusion structure comprises a plurality of first protrusions, the second protrusion structure comprises a plurality of second protrusions, and a width of each of the first protrusions is smaller than a width of each of the second protrusions.

According to one embodiment of the present application, a refractive index of the first PI film layer is n1, and $1.5 \leq n1 \leq 1.8$.

According to one embodiment of the present application, a refractive index of the second PI film layer is n2, and $n2 \geq 1.8$.

According to one embodiment of the present application, on one side of the PI substrate facing the transparent substrate, the PI substrate is provided with a recessed cone-like structure.

According to one embodiment of the present application, nanoparticles are doped in the PI substrate.

According to one embodiment of the present application, nanoparticles are doped in the first PI film layer.

According to one embodiment of the present application, the nanoparticles comprise at least one of ZnO, $TiO_2$, $ZrO_2$, $SiO_2$, or MgO.

In another aspect, the present application provides a display device, comprising a display panel and a camera, the display panel comprising:
  a transparent substrate; and
  a polyimide (PI) substrate disposed at one side of the transparent substrate, wherein an uneven structure is provided inside the PI substrate or arranged on one side of the PI substrate facing the transparent substrate.

According to one embodiment of the present application, the PI substrate comprises a first PI film layer and a second PI film layer, the first PI film layer is disposed at one side adjacent to the transparent substrate, and the second PI film layer is disposed at one side away from the transparent substrate.

According to one embodiment of the present application, the first PI film layer is provided with a first protrusion structure, the second PI film layer is provided with a second protrusion structure, the uneven structure comprises the first protrusion structure and the second protrusion structure, and the first protrusion structure and the second protrusion structure are engaged and attached to each other at an interface between the first PI film layer and the second PI film layer.

According to one embodiment of the present application, the first protrusion structure comprises a plurality of first protrusions, the second protrusion structure comprises a plurality of second protrusions, and a width of each of the first protrusions is smaller than a width of each of the second protrusions.

According to one embodiment of the present application, a refractive index of the first PI film layer is n1, and $1.5 \leq n1 \leq 1.8$.

According to one embodiment of the present application, a refractive index of the second PI film layer is n2, and $n2 \geq 1.8$.

According to one embodiment of the present application, on one side of the PI substrate facing the transparent substrate, the PI substrate is provided with a recessed cone-like structure.

According to one embodiment of the present application, nanoparticles are doped in the PI substrate.

According to one embodiment of the present application, nanoparticles are doped in the first PI film layer.

According to one embodiment of the present application, the nanoparticles comprise at least one of ZnO, $TiO_2$, $ZrO_2$, $SiO_2$, or MgO.

Compared with conventional techniques, the present invention provides an uneven structure in a PI substrate of a display panel, or the uneven structure is arranged on one side of the PI substrate facing the transparent substrate. Such configuration can solve a problem that light rays undergo total reflection at an interface between the PI substrate and air to result in a decrease in light output. When the uneven structure is provided inside the PI substrate, an incident ray is first refracted in the PI substrate, and then refracted a second time as an emergent ray at an interface between the PI substrate and the air. That is to say, a direction of the incident ray changes at the interface between the PI substrate and the air, which also changes a critical angle of total reflection for an incident ray in the display panel. When the uneven structure is arranged on the one side of the PI substrate facing the transparent substrate, the incident angle of the incident ray at the interface between the PI substrate and the air is changed. Both structures increase light output from the display panel, so more light reaches a camera, and clarity of the camera is also improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
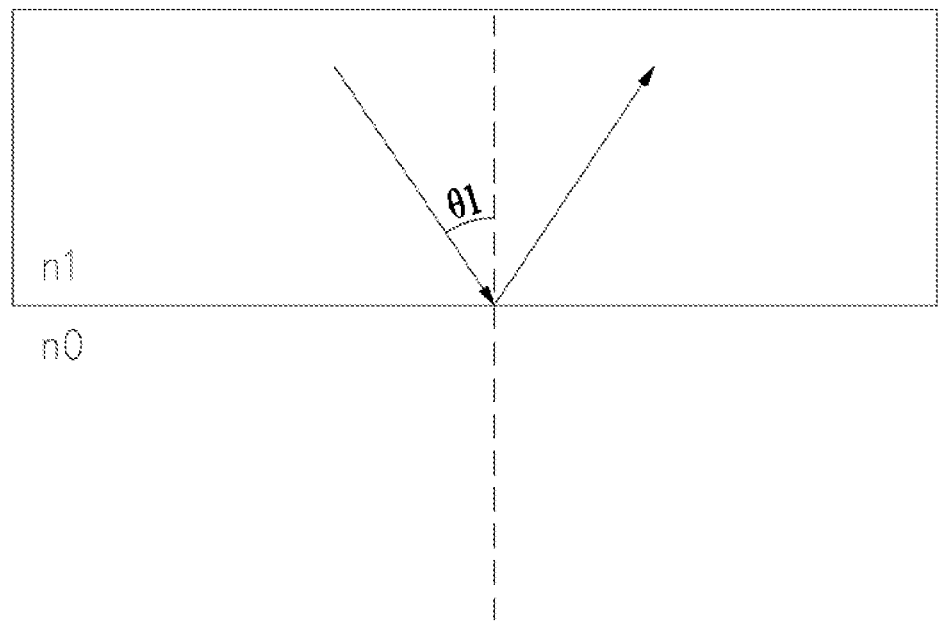
FIG. 1 is a schematic view illustrating an optical path of a conventional display panel.

Technical solutions of the present invention will be clearly and completely described below with reference to the accompanying drawings and in conjunction with specific embodiments. Obviously, the described embodiments are only some of the embodiments of the present invention, but not all the embodiments. Based on the embodiments of the present invention, all other embodiments obtained by those skilled in the art without creative work fall into the protection scope of the present invention.

In the description of the present invention, it should be understood that the directional terms, such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", are based on the orientation or positional relationship shown in the drawings, and are only for the convenience of describing the present invention and simplifying the description. The directional terms do not indicate or imply that the device or element referred to must have a specific orientation or be constructed or operated in a specific orientation. Therefore, the directional terms cannot be understood as a limitation to the present invention. In addition, the terms "first" and "second" are used for illustrative purposes only, and cannot be understood as indicating or implying relative importance or implicitly indicating the number of technical features indicated. Therefore, the features defined as "first" and "second" may explicitly or implicitly include one or more of the features. In the description of the present invention, "multiple" means two or more, unless specifically defined otherwise.

In the description of the present invention, it should be noted that the terms "mounted", "connected", and "coupled" should be understood in a broad sense unless otherwise specified and defined. For example, it can be a fixed connection, a detachable connection, or an integral connection; it can be a mechanical connection, an electrical connection, or two elements can communicate with each other. Two elements can be directly connected to each other or can be indirectly connected through an intermediate medium, or they are connected internally or interact with each other. For those of ordinary skill in the art, the specific meanings of the above terms in the present invention can be understood on a case-by-case basis.

In the present invention, unless explicitly stated and defined otherwise, a first element being "upper" or "lower"

a second element may indicate that, the first element is in direct contact with the second element, or can mean that, the first element is not in direct contact with the second element, and instead they make contact through another element between them. Moreover, the first element being "above", "over", and "on" the second element can indicate that the first element is right above and obliquely above the second element, or merely indicates that the first element is higher in level than the second element. The first element being "below", "under", or "beneath" the second element can mean that, the first element is right below or obliquely below the second element, or merely indicates that the first element is lower in level than the second element.

The following disclosure provides many different examples for realizing different structures of the present invention. To simplify the disclosure of the present invention, components and configurations of specific examples are described below. Certainly, they are merely examples and are not intended to limit the present invention. Furthermore, reference numerals and/or reference letters can be repeated in different examples, and such repetition is for the purpose of simplicity and clarity, and does not indicate any relationship between various embodiments and/or configurations discussed. In addition, the present invention provides examples of various specific processes and materials, but those of ordinary skill in the art can be aware of the use of other processes and/or the use of other materials.

Presently, in one common technique, light is emitted from a display panel into air and then received by a camera. Since a refractive index of the air can be approximately regarded as 1 (n0≈1), a refraction index of a PI substrate in the display panel is not less than 1.8 (n1≥1.8). The light is entering an optically sparse medium from an optically dense medium, so an incident ray undergoes total reflection at an interface between the PI substrate and the air. Hence, light rays are unable to pass through the display panel, which greatly compromises clarity of the camera. As shown in FIG. 1, FIG. 1 is a schematic view illustrating an optical path of a conventional display panel, taking n1=1.8, n0=1, θ1=arc sin1/1.8=33.75°. That is to say, when a light ray is incident on an interface at an angle greater than 33.75°, the light ray undergoes total reflection instead of passing through the interface. Nearly ⅔ of the light that is obliquely incident on this interface is completely reflected off and lost, which greatly reduces an amount of light that the camera can receive and affects clarity of the camera. Therefore, it is necessary to find a solution to reduce the total reflection phenomenon of light incident on the interface between the PI substrate and the air, so that more light can go out through the interface and be received by the camera.

Accordingly, the present invention provides a display panel and a display device. A detailed description is provided below.

The present invention provides a display panel. The display panel comprises a transparent substrate and a polyimide (PI) substrate disposed at one side of the transparent substrate, wherein an uneven structure is disposed inside the PI substrate or arranged on one side of the PI substrate facing the transparent substrate.

Figure 2:
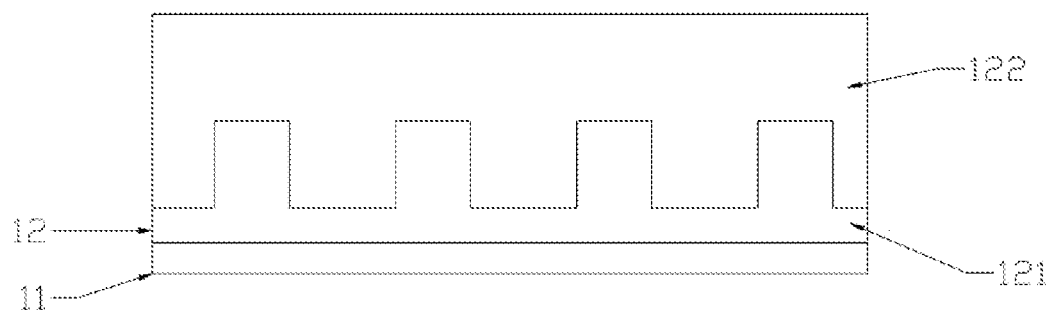
FIG. 2 is a schematic view illustrating a display panel according to one embodiment of the present invention.

Please refer to FIG. 2. FIG. 2 is a schematic view illustrating a display panel according to one embodiment of the present invention. The display panel comprises a transparent substrate 11 and a polyimide (PI) substrate 12. The PI substrate 12 is disposed at one side of the transparent substrate 11. An uneven structure is disposed inside the PI substrate 12.

An incident ray is refracted in the PI substrate first, and then refracted a second time at an interface between the PI substrate and the air. That is to say, a direction of the incident ray changes at the interface between the PI substrate and the air. A critical angle of total reflection of the incident ray in the display panel also changes.

In the present embodiment, when the uneven structure is disposed inside the PI substrate, the PI substrate comprises a first PI film layer 121 and a second PI film layer 122, the first PI film layer 121 is disposed at one side adjacent to the transparent substrate 11, and the second PI film layer 122 is disposed at one side away from the transparent substrate 11.

In detail, a refractive index of the first PI film layer 121 is n1, a refractive index of the second PI film layer 122 is n2, and n1<n2. n1 and n2 are both much larger than a refractive index (n0=1) of the air. Preferably, n1 satisfies 1.5≤n1≤1.8, and n2 satisfies n2≥1.8.

Figure 3:
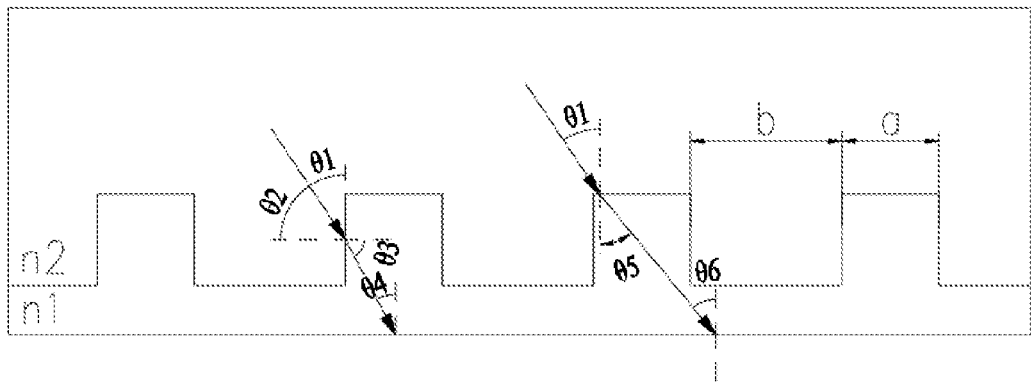
FIG. 3 is a schematic view illustrating an optical path of a polyimide (PI) substrate according to one embodiment of the present invention.

It is preferable that the first PI film layer 121 is provided with a first protrusion structure, the second PI film layer 122 is provided with a second protrusion structure, the uneven structure comprises the first protrusion structure and the second protrusion structure, and the first protrusion structure and the second protrusion structure are engaged and attached to each other at an interface between the first PI film layer 121 and the second PI film layer 122. The first protrusion structure comprises a plurality of first protrusions, and the second protrusion structure comprises a plurality of second protrusions. Referring to FIG. 3, FIG. 3 is a schematic view illustrating an optical path of the PI substrate according to one embodiment of the present invention.

Assume that an incident ray is refracted for the first time at a lateral side of the first protrusion of the first PI film layer 121, and an initial incident angle is θ1. At this point, an incident angle is θ2, an emergent angle is θ3, and then the incident ray is refracted a second time at an interface between the PI substrate and air. At this time, an incident angle is θ4. n1<n2, θ3>θ2, and θ1+θ2=90°, θ3+θ4=90°, so under the condition that the above requirements are met, it is derived that θ1>θ4, the incident angle θ4 of the incident ray at the interface between the PI substrate and the air is smaller than the initial incident angle θ1, so the initial incident angle for total reflection to just occur is increased, and the critical angle of total reflection of the incident ray in the display panel is also increased.

Assume that an incident ray is refracted for the first time at a top surface of the first protrusion of the first PI film layer 121, and an initial incident angle is θ1. At this point, an incident angle is also θ1, and an emergent angle is θ5. The incident ray is refracted a second time at the interface between the PI substrate and the air. At this time, the incident angle is θ6. n1<n2, θ5>θ1, and θ5=θ6, and therefore, under the condition that the above requirements are met, it is derived that θ1<θ6. The incident angle θ6 at the interface between the PI substrate and the air is larger than the initial incident angle θ1, so the initial incident angle for total reflection to just occur is decreased, and the critical angle of total reflection of the incident ray in the display panel is also decreased.

In summary, to increase light output from the display panel, the critical angle that yields total reflection of the incident ray at the interface between the PI substrate and the air needs to be increased as much as possible. In other words, incident rays of more angles are required to undergo first refraction at the lateral surface of the first protrusion of the first PI film layer, so that as few incident rays as possible undergo first refraction at a top surface of the first protrusion of the first PI film layer. A width of the first protrusion is a, and a width of the second protrusion is b, and the above purpose can be achieved if a is smaller than b.

Figure 4:
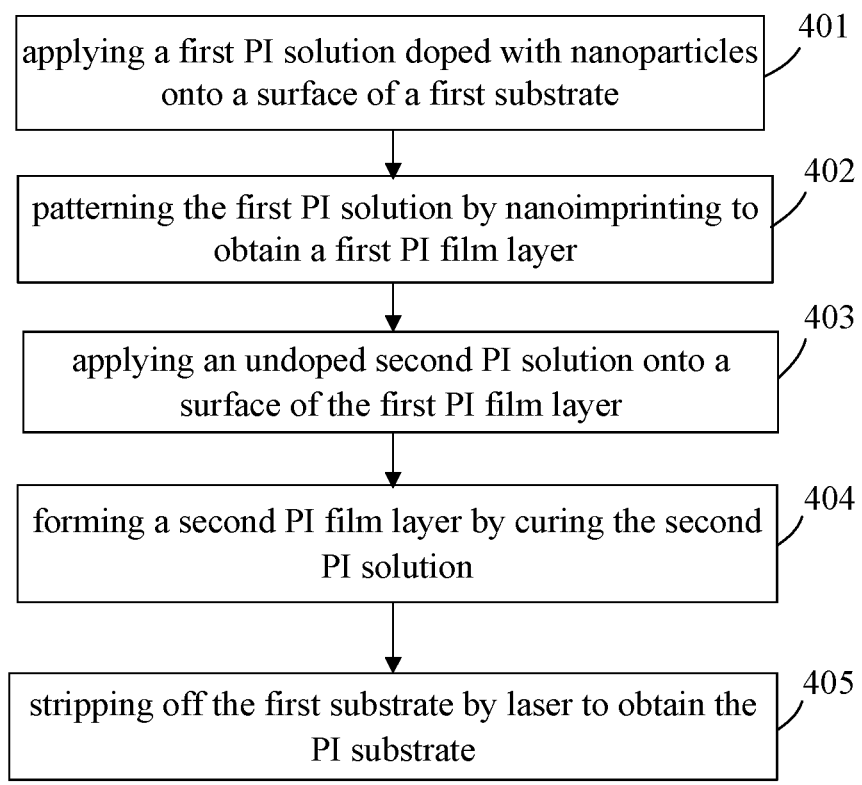
FIG. 4 is a process flow diagram illustrating a manufacturing method of the PI substrate according to one embodiment of the present invention.
Figure 5:
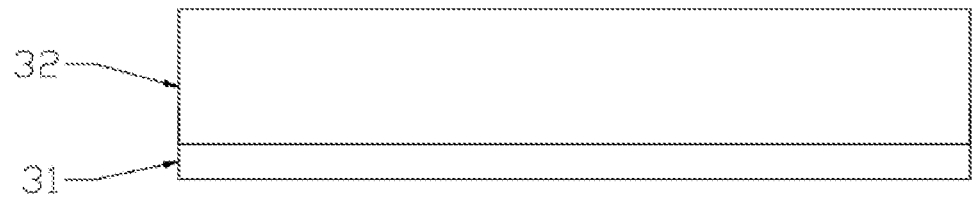
FIG. 5 is a schematic structural view illustrating the PI substrate according to one embodiment of the present invention.

Based on the same technical concept, the present invention also provides a manufacturing method of the PI substrate mentioned above. As shown in FIG. 4, it is a process flow diagram illustrating the manufacturing method of the PI substrate, the manufacturing method comprising:

step 401: applying a first PI solution 32 doped with nanoparticles onto a surface of a first substrate 31;

Specifically, as shown in FIG. 5, FIG. 5 is a schematic view illustrating the PI substrate after the first coating, the PI substrate comprising the first substrate 31 and the first PI solution 32.

Step 402: patterning the first PI solution 32 by nanoimprinting to obtain a first PI film layer 321.

Figure 6:
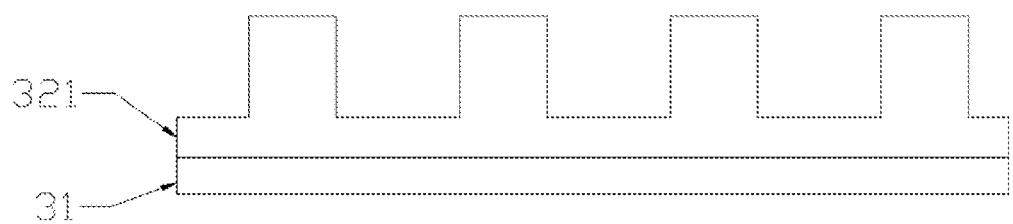
FIG. 6 is a schematic structural view illustrating the PI substrate according to one embodiment of the present invention.

Specifically, as shown in FIG. 6, FIG. 6 is a schematic view illustrating the PI substrate after nanoimprinting is completed, the PI substrate comprising the first PI film layer 321.

Step 403: applying an undoped second PI solution onto a surface of the first PI film layer 321.

Step 404: forming a second PI film layer 33 by curing the second PI solution.

Figure 7:
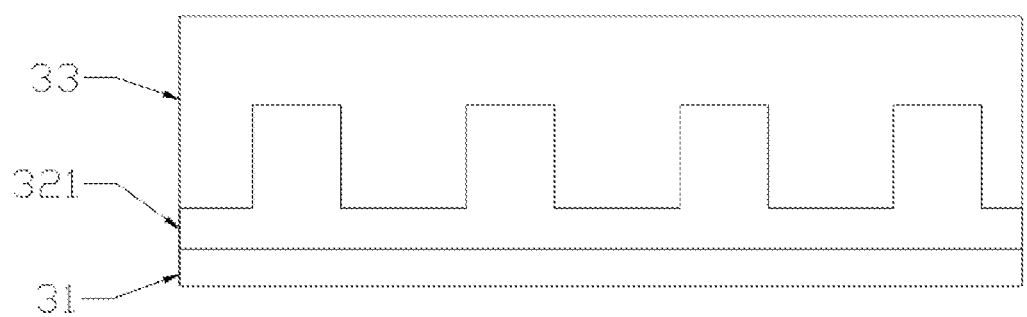
FIG. 7 is a schematic structural view illustrating the PI substrate according to one embodiment of the present invention.

Specifically, as shown in FIG. 7, FIG. 7 is a schematic view of the PI substrate after the second coating, the PI substrate comprising the second PI film layer 33.

Step 405: stripping off the first substrate 31 by laser to obtain the PI substrate.

Figure 8:
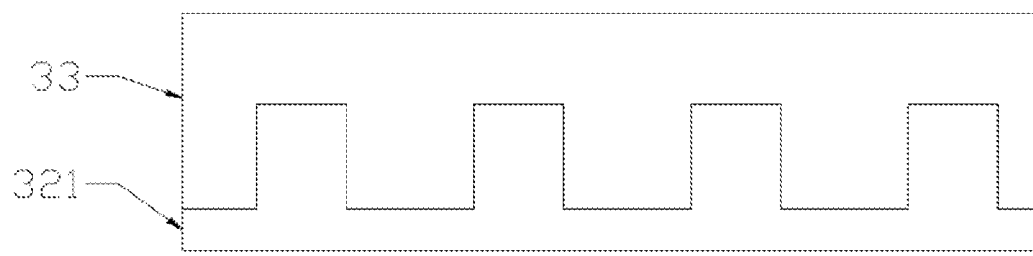
FIG. 8 is a schematic structural view illustrating the PI substrate according to one embodiment of the present invention.

Specifically, as shown in FIG. 8, FIG. 8 is a schematic view illustrating the PI substrate obtained.

Figure 9:
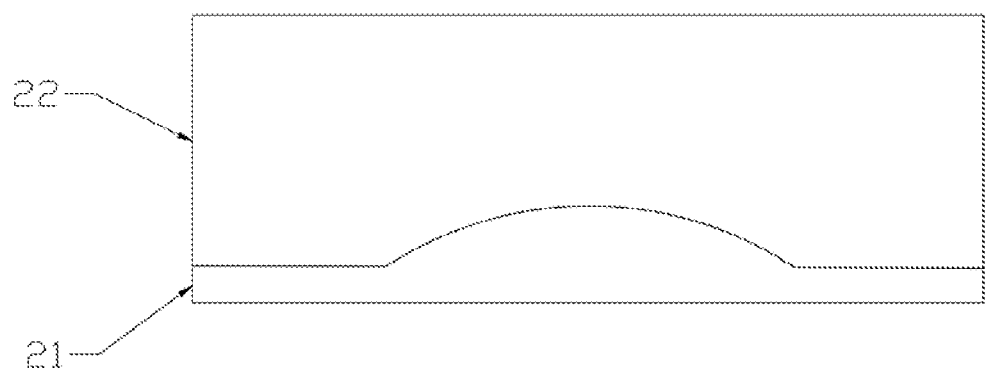
FIG. 9 is a schematic view illustrating the display panel according to one embodiment of the present invention.

FIG. 9 shows another embodiment of the present invention. FIG. 9 is a schematic view illustrating a display panel according to one embodiment of the present invention, the display panel comprising a transparent substrate 21 and a polyimide (PI) substrate 22 disposed at one side of the transparent substrate 21, wherein an uneven structure is arranged on one side of the PI substrate 22 facing the transparent substrate.

Figure 10:
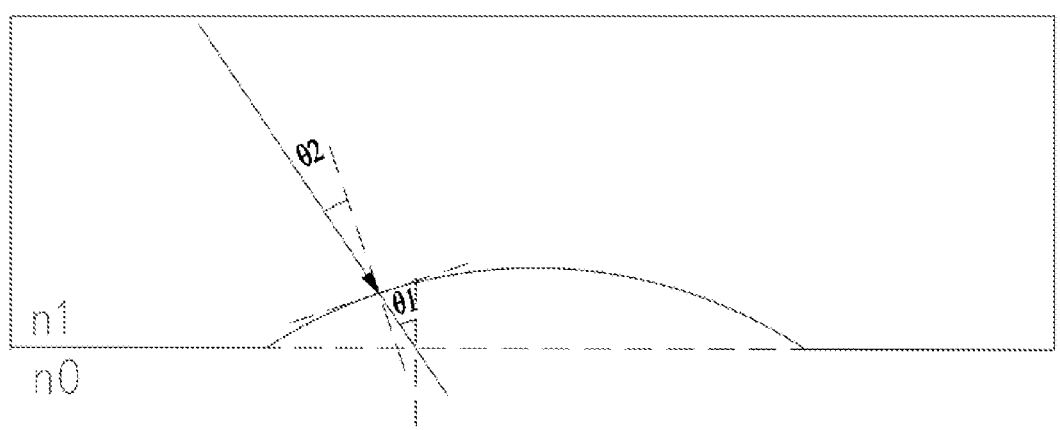
FIG. 10 is a schematic view illustrating the display panel according to one embodiment of the present invention.

In the present embodiment, when the uneven structure is arranged on one side of the PI substrate facing the transparent substrate, a recessed cone-like structure is arranged on one side of the PI substrate 22 facing the transparent substrate. One side of the transparent substrate 21 facing the PI substrate 22 is provided with a structure which is attached in conformity with the uneven structure, that is, the side of the transparent substrate 21 facing the PI substrate 22 is provided with a protruding cone-like structure. As shown in FIG. 10, FIG. 10 is a schematic view illustrating an optical path of the display panel according to one embodiment of the present invention. A refractive index of the air can be regarded as approximately 1 ($n0 \approx 1$). A refractive index of the PI substrate in the display panel is not less than 1.8 ($n_1 \geq 1.8$). An initial incident angle of an incident ray before the PI substrate is patterned is $\theta1$. After the PI substrate is patterned, an incident angle of the incident ray in the same incident direction is $\theta2$, and $\theta1 > \theta2$, then the incident rays of more angles will be refracted and go out from an interface between the PI substrate and the air, without causing total reflection to occur.

In the present invention, nanoparticles are doped in the PI substrate. The nanoparticles comprise at least one of $ZnO$, $TiO_2$, $ZrO_2$, $SiO_2$, or $MgO$. The nanoparticles can be distributed only within the first PI film layer, or can be distributed throughout the PI substrate, and the nanoparticles can consist of a pure substance or a mixture.

Figure 11:
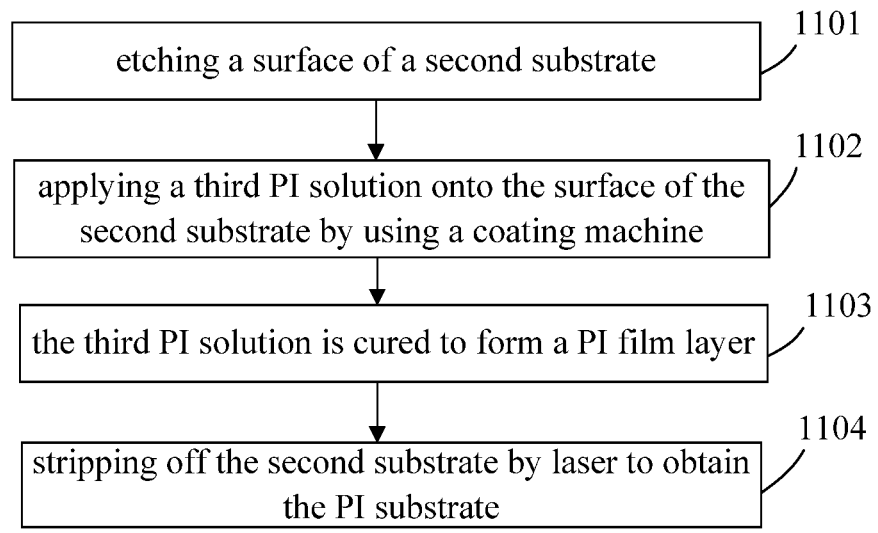
FIG. 11 is a process flow diagram illustrating the manufacturing method of the PI substrate according to one embodiment of the present invention.
Figure 12:
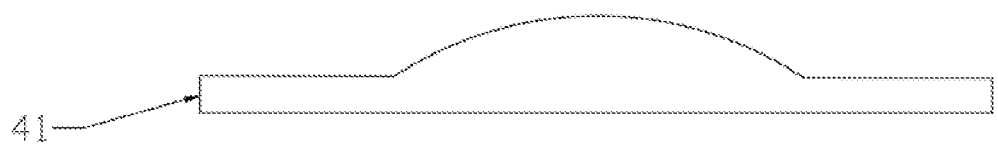
FIG. 12 is a schematic structural view illustrating the PI substrate according to one embodiment of the present invention.

Based on the same technical concept, the present invention also provides a manufacturing method of the PI substrate mentioned above. As shown in FIG. 11, FIG. 11 is a process flow diagram illustrating the manufacturing method of the PI substrate according to one embodiment of the present invention, the manufacturing method comprising:

step 1101: etching a surface of a second substrate 41;

Referring to FIG. 12, specifically, FIG. 12 is a schematic view of the PI substrate after etching, and the etched PI substrate comprises the second substrate 41.

Step 1102: applying a third PI solution onto the surface of the second substrate 41 by using a coating machine.

Step 1103: the third PI solution is cured to form a PI film layer 42.

Figure 13:
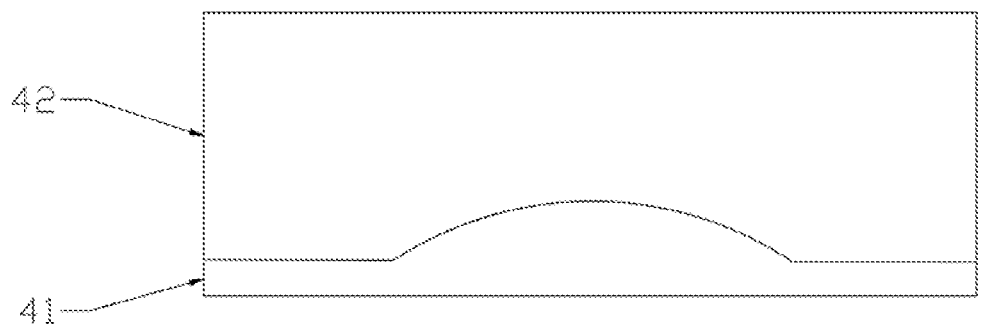
FIG. 13 is a schematic structural view illustrating the PI substrate according to one embodiment of the present invention.

Referring to FIG. 13, FIG. 13 is a schematic view illustrating the PI substrate after the coating (the third PI solution) is cured, the PI substrate comprising the PI film layer 42.

Step 1104: stripping off the second substrate 41 by laser to obtain the PI substrate.

Figure 14:
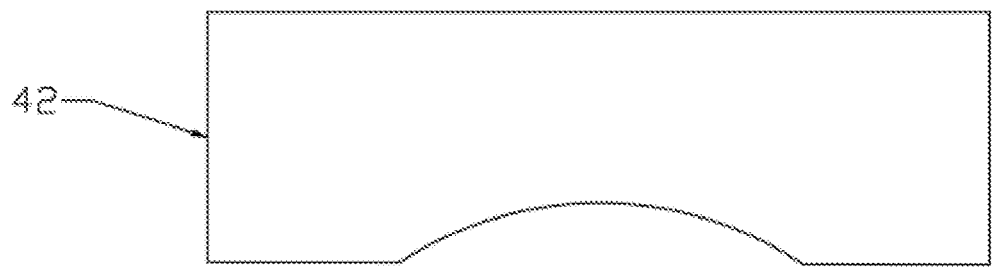
FIG. 14 is a schematic structural view illustrating the PI substrate according to one embodiment of the present invention.

Referring to FIG. 14, FIG. 14 is a schematic view illustrating the PI substrate obtained.

In order to better implement the display panel of the present invention, the present invention further provides a display device on the basis of the display panel. The display device comprises the display panel and the camera described in the above embodiments.

By using the display panel described in the above embodiments, the performance of the display device is improved.

In the above embodiments, the description of each embodiment has its own emphasis. For those that are not described in detail in one embodiment, reference may be made to related descriptions in other embodiments.

The present invention is described in detail above. Specific examples are provided to explain the working principles and embodiments of the present invention. The descriptions of the above embodiments are only for ease of understanding of the technical solution and main ideas of the present invention. Those of ordinary skill in the art should be able to modify the technical solutions described in the foregoing embodiments, or equivalently replace some of the technical features. Such modifications or replacements are deemed to be within the protection scope of the present invention.

What is claimed is:

1. A display device, comprising a display panel and a camera, the display panel comprising:
   a transparent substrate; and
   a polyimide (PI) substrate disposed at one side of the transparent substrate, wherein an uneven structure is provided inside the PI substrate, wherein the PI substrate comprises a first PI film layer and a second PI film layer, the first PI film layer is disposed at one side adjacent to the transparent substrate, the second PI film layer is disposed at one side away from the transparent substrate, a refractive index of the first PI film layer is n1, a refractive index of the second PI film layer is n2, and n1<n2,
   wherein the first PI film layer is provided with a first protrusion structure, the second PI film layer is provided with a second protrusion structure, the uneven structure comprises the first protrusion structure and the second protrusion structure, and the first protrusion structure and the second protrusion structure are engaged and attached to each other at an interface between the first PI film layer and the second PI film layer,
   wherein the first protrusion structure comprises a plurality of first protrusions, the second protrusion structure comprises a plurality of second protrusions, and a width of each of the first protrusions is less than a width of each of the second protrusions, wherein the camera is disposed under the PI substrate and the transparent substrate at a distance.

2. The display device according to claim 1, wherein a refractive index of the first PI film layer is n1, and $1.5 \leq n1 \leq 1.8$.

3. The display device according to claim 1, wherein a refractive index of the second PI film layer is n2, and $n2 \geq 1.8$.

4. The display device according to claim 1, wherein an auxiliary uneven structure is arranged on the one side of the PI substrate facing the transparent substrate, the uneven structure is a recessed cone-like structure.

5. The display device according to claim 1, wherein nanoparticles are doped in the PI substrate.

6. The display device according to claim 1, wherein nanoparticles are doped in the first PI film layer.

7. The display device according to claim 5, wherein the nanoparticles comprise at least one of $ZnO$, $TiO_2$, $ZrO_2$, $SiO_2$, or $MgO$.

* * * * *